United States Patent [19]
Diaz et al.

[11] Patent Number: 5,503,887
[45] Date of Patent: Apr. 2, 1996

[54] CONDUCTIVE WOVEN MATERIAL AND METHOD

[75] Inventors: Rodolfo E. Diaz, Phoenix; Jeffrey W. Peebles, Tempe; Michael C. Miller, Chandler; Robert A. Petrisko, Gilbert, all of Ariz.

[73] Assignee: Northrop Grumman Corporation, Los Angeles, Calif.

[21] Appl. No.: 368,784

[22] Filed: Jan. 4, 1995

[51] Int. Cl.$^6$ .................................................. B32B 3/00
[52] U.S. Cl. .................... 428/58; 156/152; 156/159; 156/250; 156/251; 156/256; 156/266; 156/304.1; 156/304.6; 428/116; 428/192; 428/193; 428/225; 428/257; 428/258; 428/259; 428/902
[58] Field of Search ...................... 428/51, 57, 58, 428/60, 116, 192, 193, 225, 257, 258, 259, 902; 156/152, 159, 250, 251, 256, 266, 304.1, 304.6

[56] References Cited

U.S. PATENT DOCUMENTS

| | | | |
|---|---|---|---|
| 4,234,648 | 11/1980 | Patz et al. | 428/245 |
| 4,486,490 | 12/1984 | Patz et al. | 428/245 |
| 4,557,968 | 12/1985 | Thornton et al. | 428/229 |
| 4,752,415 | 6/1988 | Iwaskow et al. | 252/511 |
| 4,842,905 | 6/1989 | Stech | 428/58 |
| 4,845,343 | 7/1989 | Aune et al. | 219/545 |
| 4,882,089 | 11/1989 | Iwaskow et al. | 428/242 |
| 4,983,456 | 1/1991 | Iwaskow et al. | 428/254 |
| 5,071,699 | 12/1991 | Pappas et al. | 428/265 |
| 5,102,727 | 4/1992 | Pittman et al. | 428/259 |
| 5,250,094 | 10/1993 | Chung et al. | 55/523 |
| 5,312,511 | 5/1994 | Fell | 156/469 |
| 5,358,492 | 10/1994 | Feibus | 604/264 |
| 5,405,683 | 4/1995 | Sandusky et al. | 428/225 |

*Primary Examiner*—James J. Bell
*Attorney, Agent, or Firm*—Terry J. Anderson; Karl J. Hoch, Jr.

[57] ABSTRACT

A conductive woven material (2) being conductive, and preferably equally conductive, in all directions is made using woven fabric (4) having conductive weft fibers (10). The material is produced by cutting the woven fabric at a first, acute angle (19) to the side edges (12, 14) to produce trapezoidally-shaped cut fabric pieces (18). The cut fabric pieces are then reoriented so that the former side edges of the fabric are placed to abut one another to create a reconstructed fabric (20) in which the weft fibers are at acute angle (22) to the length of the reconstructed fabric. Two layers of reconstructed fabric (24, 26) are placed one upon the other, with one upside down, so that the conductive weft fibers are at an angle, preferably 90°, to one another so to create the conductive woven material. The conductive woven material can be used to form, for example, conductive laminates or conductive honeycomb material.

19 Claims, 3 Drawing Sheets

RESULTING HONEYCOMB USING CONDUCTIVE WEB 20.

CONDUCTIVE WOVEN MATERIAL AND METHOD

BACKGROUND OF THE INVENTION

Electromagnetic radiation (EMR) absorbing materials are used for many different purposes. They can be used to create anechoic chambers, to reduce spurious signals near airport radar installations, to shield electronic components from electromagnetic interference (EMI), to prevent the escape of radiation from radiation-producing devices, such as a microwave oven, as well as many other uses.

EMR-absorbing materials are made in many different ways. One way is to use a block of foam with carbon particles dispersed within the foam. Composite laminates are sometimes made so that they absorb EMR. One type of conductive composite laminate uses a fabric having conductive fibers woven into the fabric. See U.S. Pat. No. 5,102,727 to Pittman. Conductive fabrics can also be used in making honeycomb and other open-celled materials; these are especially useful in applications where high strength-to-weight ratios are needed.

While the Pittman patent shows a method for obtaining multi-directional conductivity within a fabric, it has its drawbacks. Weaving conductive yarns in the fill or weft direction is highly flexible since, for example, non-conductive weft fibers can easily be replaced by conductive weft fibers during the weaving operation. Changing warp or web fibers during a weaving operation is, however, laborious and expensive.

SUMMARY OF THE INVENTION

The present invention is directed to a method of making a conductive woven material having significant conductivity over a range of directions, preferably generally equal conductivity in all directions, by using a woven material with conductive weft or warp fibers only.

The conductive woven material is made using woven fabric having conductive weft fibers extending between the side edges of the fabric and, typically, non-conductive web fibers. The conductive woven material is produced by first cutting the woven fabric at a first acute angle to the side edges to produce trapezoidally-shaped cut fabric pieces. The trapezoidally-shaped cut fabric pieces are then reoriented so that the former side edges of the fabric are placed to abut one another to create a reconstructed fabric in which the weft fibers are at a second acute angle to the length of the reconstructed fabric. Two layers of the reconstructed fabric are placed one upon the other so that the conductive weft fibers of one layer are at an angle to the conductive weft fibers of the other layer so to create a two-layered conductive woven material which can be used to form conductive materials such as laminates or honeycomb. As used in this application, fibers include yarns, filaments, wires and other strands of metallic and non-metallic material.

A primary advantage of the invention is that it permits the manufacture of a conductive woven material, suitable for the use in making laminate as well as honeycomb structures, which provides conductivity, and preferably equal conductivity, in all directions without resorting to laborious and expensive weaving techniques.

Another aspect of the invention is the recognition that by cutting the woven fabric at a first acute angle of 45°, equal conductivity in all directions is achieved for the conductive woven material. A further aspect is the recognition that by using a first acute angle other than 45°, that anisotropic conductivity can be achieved in the final conductive woven material which is more conductive in some directions and less conductive in others but provides some conductivity in all directions.

Other features and advantages of the invention will appear from the following description in which the preferred embodiment has been described in detail in conjunction with the accompanying drawings.

DESCRIPTION OF THE PREFERRED METHOD AND EMBODIMENT

Figure 4:
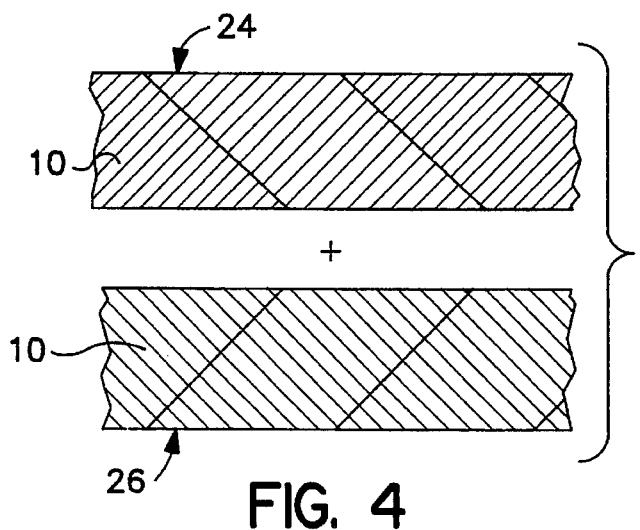
FIG. 4 suggests taking first and second lengths of the reconstructed fabric and turning one upside down relative to the other so that the conductive weft fibers of each are at 90° angles to one another.
Figure 5:
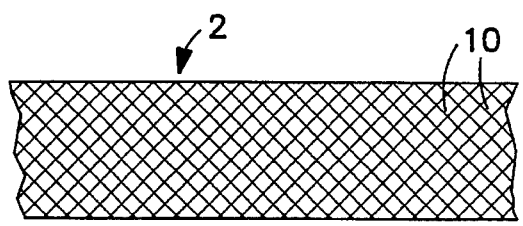
FIG. 5 shows a conductive woven material made by Joining the first and second lengths of reconstructed fabric of FIG. 4 with the conductive weft fibers at 90° to one another so that the woven material has generally equal conductivity in all directions.

FIGS. 1–5 illustrate the steps for making the conductive woven material 2 shown in FIG. 5. A length of woven fabric 4 is made having a warp direction 6 and a weft direction 8. Web direction 6 is the continuous length of the fabric and typically includes the structural fibers of the fabric. Conductive weft fibers 10 extend between the side edges 12, 14 of fabric 4. The percentage of conductive weft fibers 10 to non-conductive weft fibers can be varied from 100% to some minimal percentage according to the conductivity of the individual fibers 10 and the total conductivity desired for material 2. Typically a roll of woven fabric 4 is made and then the following procedures are carried out to make conductive woven material 2.

Figure 1:
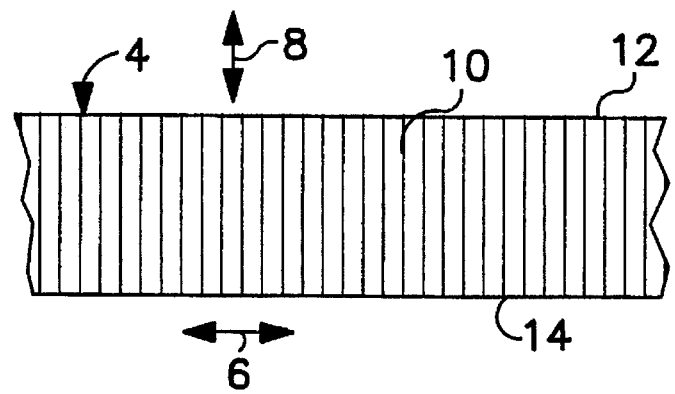
FIG. 1 illustrates a length of a woven fabric having conductive weft fibers.
Figure 2:
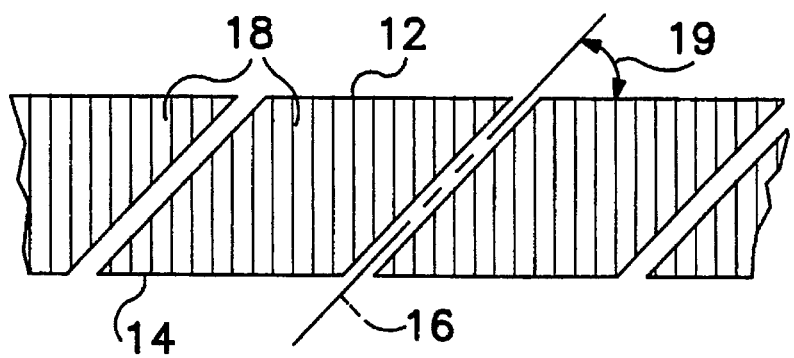
FIG. 2 illustrates cutting the fabric of FIG. 1 along 45° cutting lines to create cut fabric pieces.
Figure 3:
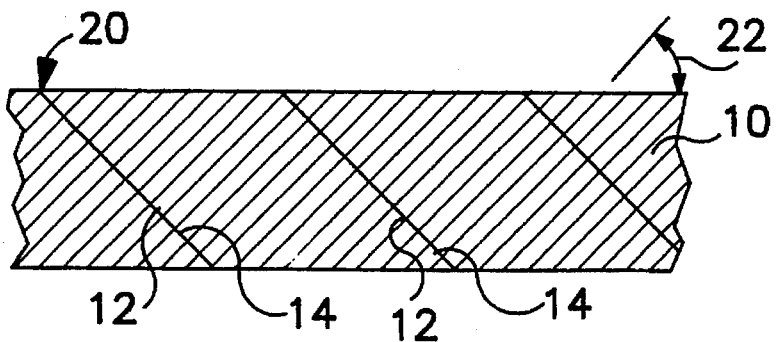
FIG. 3 illustrates the cut fabric pieces of FIG. 2 with the side edges abutting to create a length of reconstructed fabric in which the weft fibers are at a 45° angle to the length of the reconstructed fabric.

FIG. 2 illustrates a length of woven fabric 4 cut along cutting lines 16 to create trapezoidally-shaped cut fabric pieces 18. Cutting lines 16 are at a first acute angle 19 to side edges 12, 14. In this embodiment, angle 19 is about 45°. Cut fabric pieces 18 are reassembled as at FIG. 3 with what used to be side edges 12, 14 of each cut fabric piece 18 abutting the side edge of the adjacent cut fabric piece so that a length of reconstructed fabric 20 is produced. Conductive weft fibers 10 of fabric 20 are oriented at a second acute angle 22 to the length of fabric 20. Since first acute angle 19 is 45° angle 22 is also 45°.

The joining of cut fabric pieces 18 can be accomplished in a variety of ways including adhesively bonding the edges together, employing thermoplastic yarns in the fabric which will fuse together under heat and pressure or impregnating the cloth before cutting with a heat fusable binder. Fusable "prepreg" resins, like partially cured phenolic, polyimide, polyamide-imide or epoxies that are completely cured after the sheets are stacked and aligned, can be used.

After making a roll of reconstructed fabric 20, about half of the reconstructed fabric is unwound from the roll, separated from the remainder of the fabric on the roll. The roll is then turned upside down and the remaining fabric is unwound from the roll to create first and second lengths 24, 26 of reconstructed fabric 20 with conductive weft fibers 10 oriented at a 90° angle to one another. The result of this joining is illustrated in FIG. 5 showing conductive woven material 2 with conductive weft fibers 10 oriented at a 90° angle to one another. The joining of lengths 24, 26 can be accomplished by fusing the fabrics together through the use of an intermediate thermoplastic layer in a hot roller system, by sewing the two webs together, or other mechanical attachment methods. Conductive woven material 2 can be used to make conductive laminates or to make conductive honeycomb structures. By the same art, conductive fabric 20 can also be used alone to make conductive honeycomb structures possessing desirable electromagnetic properties.

Figure 6:
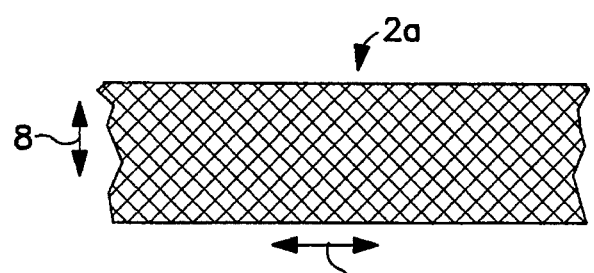
FIGS. 6 and 7 illustrate a first and second alternative embodiment of the conductive woven material of FIG. 5, in which the conductive weft fibers extend between the side of the woven material at one acute angle of more than 45° and less than 45° respectively to provide unequal conductivity in different ,directions.
Figure 7:
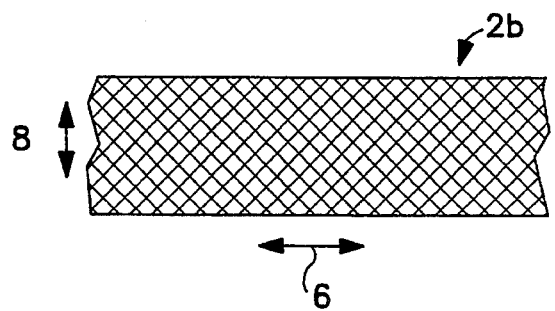

Orienting cutting line 16 at a 45° angle to conductive weft fibers 10 creates a conductive woven material 2 having substantially the same conductivity in all directions. Varying angle 19 of cutting line 16 will change the orientation of conductive weft fibers 10 to be oriented primarily in weft direction 8 as shown in FIG. 6 or in primarily in web direction 6 as shown in FIG. 7. In the embodiment of FIG. 6 electrical conductivity in weft directions 8 is greater than in web direction 6 while the opposite is true in the embodiment of FIG. 7.

EXAMPLE

The following example illustrates the construction of a conductive honeycomb structure according to the invention.

Figure 8:
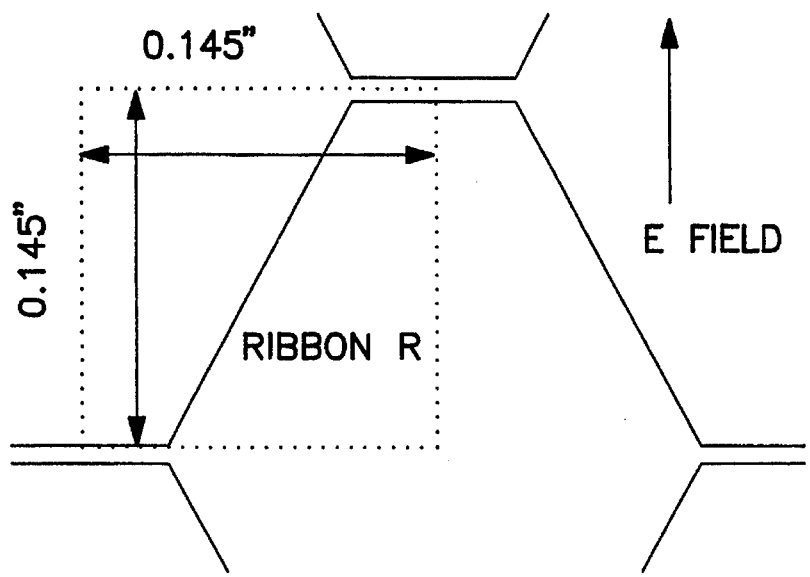
FIG. 8 is a plan view of a unit cell for the disclosed example.

Assume a designer requires a conducting honeycomb material with approximately −20 dB of insertion loss per inch. Such a material would have conductivity of the order of 0.57 Siemens/meter. Choosing a honeycomb whose periodicity is characterized by a unit cell of the order of 0.145 inches (0.00368 meters) as shown in FIG. 8, the total conductance in the unit cell can be estimated to be $$G_{total} = \frac{0.57 \text{ S/m} \cdot 0.00368 \text{ m} \cdot \text{unit depth}}{0.00368 \text{ m}}$$

At the same time the total conductance contributed by the ribbon of R ohms per square approximately subtending the diagonal of the periodic unit is of the order of $$G_{total} = \left(\frac{1}{R}\right) \frac{\text{unit depth}}{0.00368 \text{ m} \cdot \sqrt{2}}$$

Since these two conductances must be equal, 1/R=0.00297 Siemens or R=337 ohms.

That is, we need a web whose surface resistance is of the order of 337 ohms per square. The desired web is easily constructed by using a conductive fiber with a resistance per centimeter of the order of 1000 ohms, such as W. L. Gore's experimental #FR89-76-A fiber. This fiber consists of expanded PTFE filled with carbon. Other suitable fibers such as glass fibers coated with the conductive polymer polypyrrole as supplied by Milliken could also be used. Using the Gore fiber, and placing it at a density of eight fibers per inch in the weft of the web results in a web resistance for waves polarized parallel to the fiber of the order of 1000 ohms.2.54/8=318 ohms per square, which is within five percent of the desired value.

Having chosen the fiber and its density of placement, the conductive web is constructed by replacing one strand of the standard 108 glass weft fibers with the conductive fibers, every ⅛th of an inch. After the web is completed, it is cut into 45 degree parallelograms as shown in FIG. 2 and reassembled as in FIG. 3 by the above-described reconstruction method into web 20.

To make the honeycomb using an expansion process, half the roll is unwound and rewound upside down into a separate mandrel as suggested in FIG. 4. (Alternatively, each web of the honeycomb could be made from a roll of the material 2, 2a or 2b shown in FIGS. 5, 6 and 7.) Then each roll is run through the nodelining manufacturing step of the honeycomb making process. In this step, a series of parallel adhesive lines are printed across the web, separated by a prescribed "pitch" distance from each other. By virtue of the fact that the second roll was wound upside down, one roll has adhesive nodelines at +45 degrees relative to the conducting fibers, while the other roll has them at −45 degrees relative to the conductive fibers.

Each of the nodelined rolls of web are cut into individual sheets of the dimension required for the final block of material. At the end of this "sheeting" process, there are two stacks of sheets, one each roll. Now, following the standard honeycomb process these sheets are to be "layed-up" on top of each other by alternating the nodelines of one sheet with the blank spaces in between the nodelines of the sheet under it. For our material we also alternate selecting sheets from one stack and then the other. The result is that when the entire stack of sheets is pressed together to cure the adhesive lines and form the "honeycomb before expansion" (or HOBE®), adjacent sheets contain alternating conductive lines, as suggested in FIG. 5.

Figure 9:
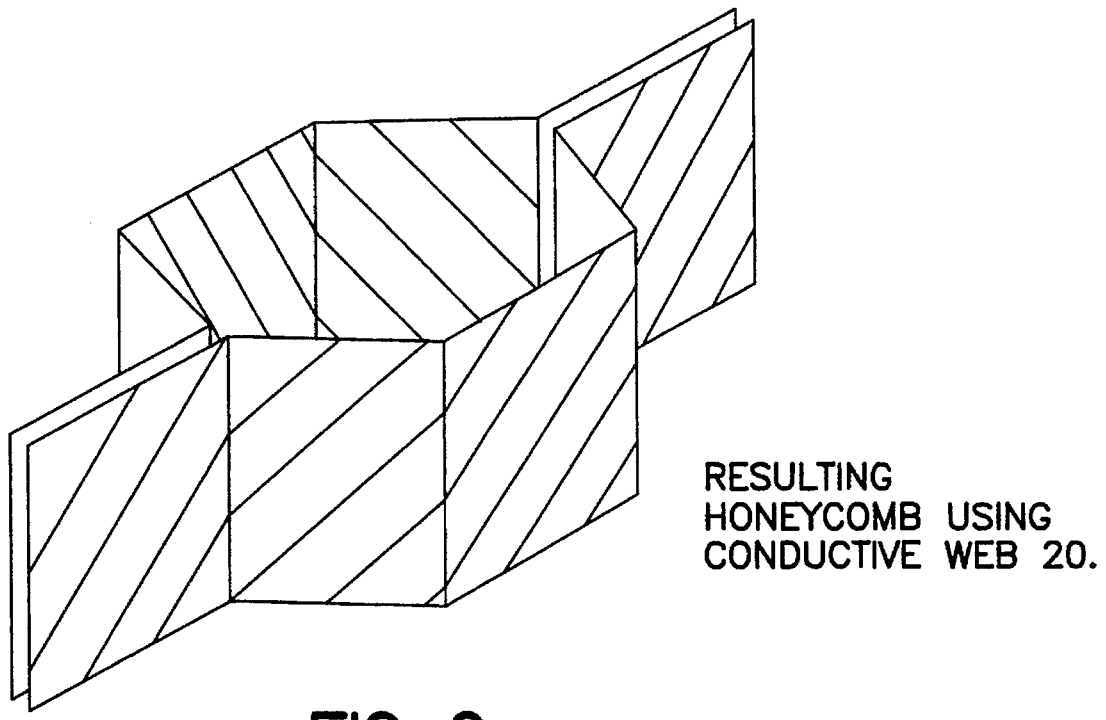
FIG. 9 is an overall view illustrating a honeycomb-made according to the example.

When this HOBE® is expanded and the cells formed, one ribbon of every hexagonal cell will contain conducting fibers at +45 degrees to the axis of the cell, while the other ribbon will contain conducting fibers at −45 degrees to the axis of the cell as shown in FIG. 9. As long as the cell is small compared to the wavelength of the incident electromagnetic wave, the material will appear to possess an average ribbon conductivity that is equal in all directions giving the desired −20 dB/inch.

The type of conductive fibers which can be used include the following examples:

1. Carbon fiber A5-4, T-300 or the like;
2. Partially pyrolyzed carbon fiber with controlled resistivity;
3. Nicalon™ ceramic fibers of different electrical grades (LVR);
4. Expanded PTFE fiber loaded with carbon to give controlled resistivity (Gortex®);
5. Stretch broken mixtures of conductive and nonconductive fibers.

The types of suitable non-conductive fibers include the following examples: E-Glass, S-Glass, Nicalon HVR, CG ceramic, Nextel™ aluminosilicate, polyethylene fiber (Spectra® from Allied Signal), polyester and other textile fibers. Suitable adhesives include epoxy, phenolic and polyimide adhesives. Thermoplastic yarns can be made from various materials including polyethylene, polypropylene, polyesters and the like.

To construct honeycomb, it may not be necessary to overlap first and second lengths 24, 26 as discussed above. Rather, one could take reconstructed fabric 20 and make vertical cuts (perpendicular to the new side edges) through the fabric and use the cut pieces to make the honeycomb. By appropriately choosing the cutting interval(s), the conductive fiber orientation can be effectively randomized in the resulting honeycomb.

Modification and variation can be made to the disclosed embodiments without departing from the subject of the invention as defined in the following claims. For example, it is possible that conductive web fibers could be used in addition to or instead of the conductive weft fibers. The spacing between the conductive fibers in the warp and/or weft direction could be varied over the length of woven fabric 4. Cutting angle 19 need not be the same for both of first and second lengths 24, 26 of reconstructed fabric. First and second lengths of reconstructed fabric 24, 26 could be made from lengths of woven fabric 4 having different compositions, including different conductive weft fibers 10; in such case weft fibers 10 for first and second lengths of reconstructed fabric 24, 26 could be at 90° to one another in woven material 2 and yet the woven material 2 would not exhibit equal conductivity in all directions. A cylindrical tube of woven material 2 could be made with conductive fibers placed in one or two directions; the tube could be slit along a helical path to produce a continuous length of fabric with the fibers oriented at acute angles to the side edges.

What is claimed is:

1. A method for making a conductive woven material comprising the following steps:

producing a woven fabric having side edges and conductive fibers;

cutting a first portion of the woven fabric at about a first, acute angle to a side edge thereof to produce first cut fabric pieces;

cutting a second portion of the woven fabric at about a second, acute angle to a side edge thereof to produce second cut fabric pieces;

assembling the first cut fabric pieces with the side edges of the first cut fabric pieces abutting one another so to create a first reconstructed fabric having a first length, having the conductive fibers parallel and having the conductive fibers at about a third, acute angle to said first length;

assembling the second cut fabric pieces with the side edges of the second cut fabric pieces abutting one another so to create a second reconstructed fabric having a second length, having the conductive fibers parallel and having the conductive fibers at about a fourth, acute angle to said second length; and combining the first and second reconstructed fabrics juxtaposed on top of one another so that their conductive fibers are at about a fifth angle to one another to create the conductive woven material with conductivity in all directions.

2. The method according to claim 1 wherein the first, acute angle equals the second, acute angle.

3. The method according to claim 1 wherein the cutting steps are carried out so that the first and second, acute angle are about 45° each, the fifth angle is about 90°, and the conductive woven material has generally equal conductivity in all directions.

4. The method according to claim 1 wherein combining step is carried out so that the conductive woven material has a length and a width, and wherein the cutting steps are carried out with said first, acute and second, acute angles being less than 45° and the fifth angle being other than about 90° so the conductivity of the conductive woven material is greater along the length than along the width.

5. The method according to claim 1 wherein combining step is carried out so that the conductive woven material has a length and a width, and wherein the cutting steps are carried out with said first, acute and second, acute angles being greater than 45° and the fifth angle being other than about 90° so the conductivity of the conductive woven material is less along the length than along the width.

6. The method according to claim 1 wherein the assembling steps are carried out by assembling the cut fabric pieces into a single length of material and cutting said single length of material in two to create said first and second reconstructed fabrics.

7. The method according to claim 1 further comprising the step of forming honeycomb from the conductive woven material.

8. The method according to claim 1 wherein the conductive fibers are weft fibers.

9. A method for making a conductive woven material comprising the following steps:

producing a woven fabric having side edges and parallel conductive fibers;

cutting a first portion of the woven fabric at about a first, acute angle to the conductive fibers to produce first cut fabric pieces;

cutting a second portion of the woven fabric at about a second, acute angle to the conductive fibers to produce second cut fabric pieces;

assembling the first cut fabric pieces with the side edges of the first cut fabric pieces abutting one another so to create a first reconstructed fabric having a first length, having the conductive fibers parallel and having the conductive fibers at about a third, acute angle to said first length;

assembling the second cut fabric pieces with the side edges of the second cut fabric pieces abutting one another so to create a second reconstructed fabric having a second length, having the conductive fibers parallel and having the conductive fibers at about a fourth, acute angle to said second length; and combining the first and second reconstructed fabrics juxtaposed on top of one another so that their conductive fibers are at about a fifth angle to one another to create the conductive woven material with conductivity in all directions.

10. The method according to claim 9 wherein the conductive fibers are weft fibers.

11. A method for making a conductive woven material comprising the following steps:

producing a woven fabric having conductive fibers extending in a first direction;

cutting a first portion of the woven fabric at about a first, acute angle to the conductive fibers to produce a first cut fabric piece;

cutting a second portion of the woven fabric at about a second, acute angle to the conductive fibers to produce a second cut fabric piece; and combining the first and second cut fabric pieces on juxtaposed top of one another so that their conductive fibers are at about a third angle to one another to create the conductive woven material with conductivity in all directions.

12. A method for making conductive honeycomb comprising the following steps:

producing a woven fabric having side edges and parallel conductive fibers;

cutting the woven fabric at about a first, acute angle to a side edge thereof to produce cut fabric pieces;

assembling the cut fabric pieces with the side edges of the cut fabric pieces abutting one another so to create a reconstructed fabric having a length, having the conductive fibers parallel and having the conductive fibers at about a second, acute angle to said first length; and forming honeycomb from the reconstructed fabric.

13. The method according to claim 12 wherein the honeycomb forming step includes the step of orienting adjacent lengths of the reconstructed fabric so the parallel conductive fibers of one said length are at an acute angle to the parallel conductive fibers of said adjacent lengths.

14. A conductive woven material comprising:

a first reconstructed fabric having a first edge and a first surface;

a second reconstructed fabric having a second edge and a second surface and mounted to the first reconstructed fabric so the first and second edges are aligned and the first and second surfaces abut;

said first and second reconstructed fabrics comprising cut pieces of trapezoidally-shaped fabric having conductive fibers oriented at first, acute and second, acute angles to the first and second edges, respectively; and said conductive fibers of the first and second reconstructed fabrics oriented at a third angle to one another to create the conductive woven material with conductivity in all directions.

15. The material of claim 14 wherein the conductive fibers are conductive weft fibers and the cut pieces of trapezoidally-shaped fabric have non-conductive web fibers oriented perpendicular to the conductive weft fibers.

16. The material of claim 14 wherein the cut pieces of trapezoidally-shaped fabric include non-conductive weft fibers oriented parallel to the conductive weft fibers.

17. The material of claim 14 wherein the third angle is about 90°.

18. The material of claim 17 wherein the conductive woven material has about equal conductivity in all directions.

19. The material of claim 14 wherein the third angle is other than about 90° and the conductive woven material has different conductivities in different directions.

* * * * *